United States Patent
Nakai

(10) Patent No.: US 7,956,611 B2
(45) Date of Patent: Jun. 7, 2011

(54) MAGNETIC RESONANCE IMAGING APPARATUS AND METHOD

(75) Inventor: Norimasa Nakai, Chiba (JP)

(73) Assignee: Hitachi Medical Corporation, Tokyo (JP)

( * ) Notice: Subject to any disclaimer, the term of this patent is extended or adjusted under 35 U.S.C. 154(b) by 408 days.

(21) Appl. No.: 11/887,326

(22) PCT Filed: Mar. 27, 2006

(86) PCT No.: PCT/JP2006/306076
§ 371 (c)(1),
(2), (4) Date: Feb. 23, 2009

(87) PCT Pub. No.: WO2006/109550
PCT Pub. Date: Oct. 19, 2006

(65) Prior Publication Data
US 2009/0206835 A1    Aug. 20, 2009

(30) Foreign Application Priority Data

Mar. 30, 2005    (JP) ................................. 2005-096865

(51) Int. Cl.
*G01V 3/00* (2006.01)
(52) U.S. Cl. ........................................ 324/307; 324/309
(58) Field of Classification Search .......... 324/300–322; 600/407–445
See application file for complete search history.

(56) References Cited

U.S. PATENT DOCUMENTS

| | | | | |
|---|---|---|---|---|
| 6,611,143 B2* | 8/2003 | Kuhara | ........................... | 324/307 |
| 6,876,201 B2* | 4/2005 | Takizawa et al. | .............. | 324/318 |
| 6,946,836 B2* | 9/2005 | Kuhara | ........................... | 324/307 |
| 7,205,765 B2* | 4/2007 | Machida et al. | ............... | 324/318 |
| 7,336,076 B2* | 2/2008 | Kuhara | ........................... | 324/318 |
| 7,723,987 B2* | 5/2010 | Bito et al. | ...................... | 324/309 |
| 2004/0070394 A1 | 4/2004 | Gonzalez Ballester et al. | | |
| 2005/0033150 A1* | 2/2005 | Takahashi et al. | ............. | 600/410 |
| 2007/0198203 A1* | 8/2007 | Kimura | ............................ | 702/85 |

(Continued)

FOREIGN PATENT DOCUMENTS

EP    1371327 A1    12/2002

(Continued)

OTHER PUBLICATIONS

Zhao X. et al., "Reduction of artifacts by optimization of the sensitivity map in sensitivity-encoded spectroscopic imaging", *Magnetic Resonance in Medicine*, Jan. 2005, vol. 53, No. 1, pp. 30 to 34.

(Continued)

*Primary Examiner* — Brij B Shrivastav
(74) *Attorney, Agent, or Firm* — Cooper & Dunham, LLP

(57) ABSTRACT

A magnetic resonance imaging apparatus comprises a plurality of high-frequency reception coils, sensitivity distribution information obtaining means for calculating sensitivity distribution information of each of the high-frequency reception coil, sensitivity distribution storage means for storing the sensitivity distribution information, measuring means for acquiring magnetic resonance signals by thinning out encode steps of a k-space, image reconstructing means for reconstructing images using the magnetic resonance signals, and means for performing unfolding calculation using the sensitivity distribution information and the image, thereby to acquire the unfolded image.
The magnetic resonance imaging apparatus further comprises means for estimating the sensitivity distribution information of a background region by using the sensitivity distribution information of an object region, and means for updating the background region by mutually using the sensitivity distribution information of the respective high-frequency receptions coils thereby to suppress noise component contained in the unfolded image.

16 Claims, 14 Drawing Sheets

U.S. PATENT DOCUMENTS

| | | | |
|---|---|---|---|
| 2008/0081987 A1* | 4/2008 | Miyazaki | 600/410 |
| 2010/0013475 A1* | 1/2010 | Kimura | 324/307 |
| 2010/0182009 A1* | 7/2010 | Crozier et al. | 324/322 |

FOREIGN PATENT DOCUMENTS

| | | | |
|---|---|---|---|
| WO | WO02/056767 A1 | 7/2002 | |

OTHER PUBLICATIONS

Huang F. et al., "Application of partial differential equation-based inpainting on sensitivity maps", *Magnetic Resonance in Medicine*, Feb. 2005, vol. 53, No. 2, pp. 388 to 397.

\* cited by examiner

MAGNETIC RESONANCE IMAGING APPARATUS AND METHOD

TECHNICAL FIELD

The present invention relates to a magnetic resonance imaging apparatus (hereinafter referred to as an MRI apparatus) and method, particularly to a technique for improving image quality using a parallel imaging method.

BACKGROUND ART

Recently in MRI apparatuses, the coils referred to as multiple RF coils or phased array coils are heavily used as a reception coil for detecting NMR signals generated from an object to be examined. This type of coil is configured arranging a plurality of high sensitivity small RF receiver coils. Also, an imaging method by thinning out phase encodes through the usage of multiple RF coils is disclosed in Patent Document 1.

This method is referred to as a parallel imaging method, and is for eliminating aliasing generated upon thinning out phase encodes using a character by which sensitivity distribution of the plurality of small RF receiver coils that are forming the multiple RF coil are spatially and mutually different.

Patent Document 1: JP-A-2002-315731

Particularly in Patent Document 1, a method is disclosed for executing unfolding by setting sensitivity of the respective small RF receiver coils in the background region as zero or a fixed number in order to reduce artifacts generated due to noise contained in background of the image.

However, in the parallel imaging method described in Patent Document 1, the image obtained by unfolding process had problems being constrained and having new artifacts generated due to drastic decline of sensitivity information in the boundary between the object region and the background region.

BRIEF SUMMARY

The objective of the present invention is to provide In an aspect of this disclosure, there are provided an MRI apparatus and a method capable of reducing artifacts generated in the unfolded image in which parallel imaging is used, whereby generating high-quality images.

In another aspect the MRI apparatus comprises:
a plurality of high-frequency reception coils;
sensitivity distribution information obtaining means for calculating the sensitivity distribution information of the plurality of high-frequency reception coils for each respectively;
sensitivity distribution storing means for storing the sensitivity distribution information;
measuring means for acquiring magnetic resonance signals by thinning out encode steps of a k-space;
image reconstructing means for reconstructing images on the basis of the magnetic resonance signals; and
means for acquiring unfolded images by performing unfolding calculation using the sensitivity distribution information and the image,
characterized in further comprising:
means for estimating the sensitivity distribution information of a background region on the basis of the sensitivity distribution information of an object region; and
means for updating the sensitivity distribution information in the respective background regions by mutually using the sensitivity distribution information of each of the plurality of high-frequency receiver coils thereby to suppress the noise component contained in the unfolded image.

In another aspect, the MRI method comprises:
(1) a step for acquiring magnetic resonance signals by thinning out encode steps of a k-space using a plurality of high-frequency receiver coils;
(2) a step for reconstructing images by using the magnetic resonance signals acquired in the step (1); and
(3) a step for acquiring the unfolded images by performing unfolding calculation using the sensitivity distribution information of the plurality of high-frequency receiver coils and the images,
characterized in further comprising:
(4) a step for estimating the sensitivity distribution information of a background region by using the sensitivity distribution information of an object region; and
(5) a step for updating the sensitivity distribution information in the respective background regions mutually using the sensitivity distribution information of the plurality of high-frequency receiver coils, thereby to suppress noise components contained in the unfolded images.

Thus, an MRI apparatus and a method are provided capable of reducing artifacts generated on the unfolded images in parallel imaging and generating high-quality images.

BRIEF DESCRIPTION OF THE DIAGRAMS

BEST MODE FOR CARRYING OUT THE INVENTION

Figure 1:
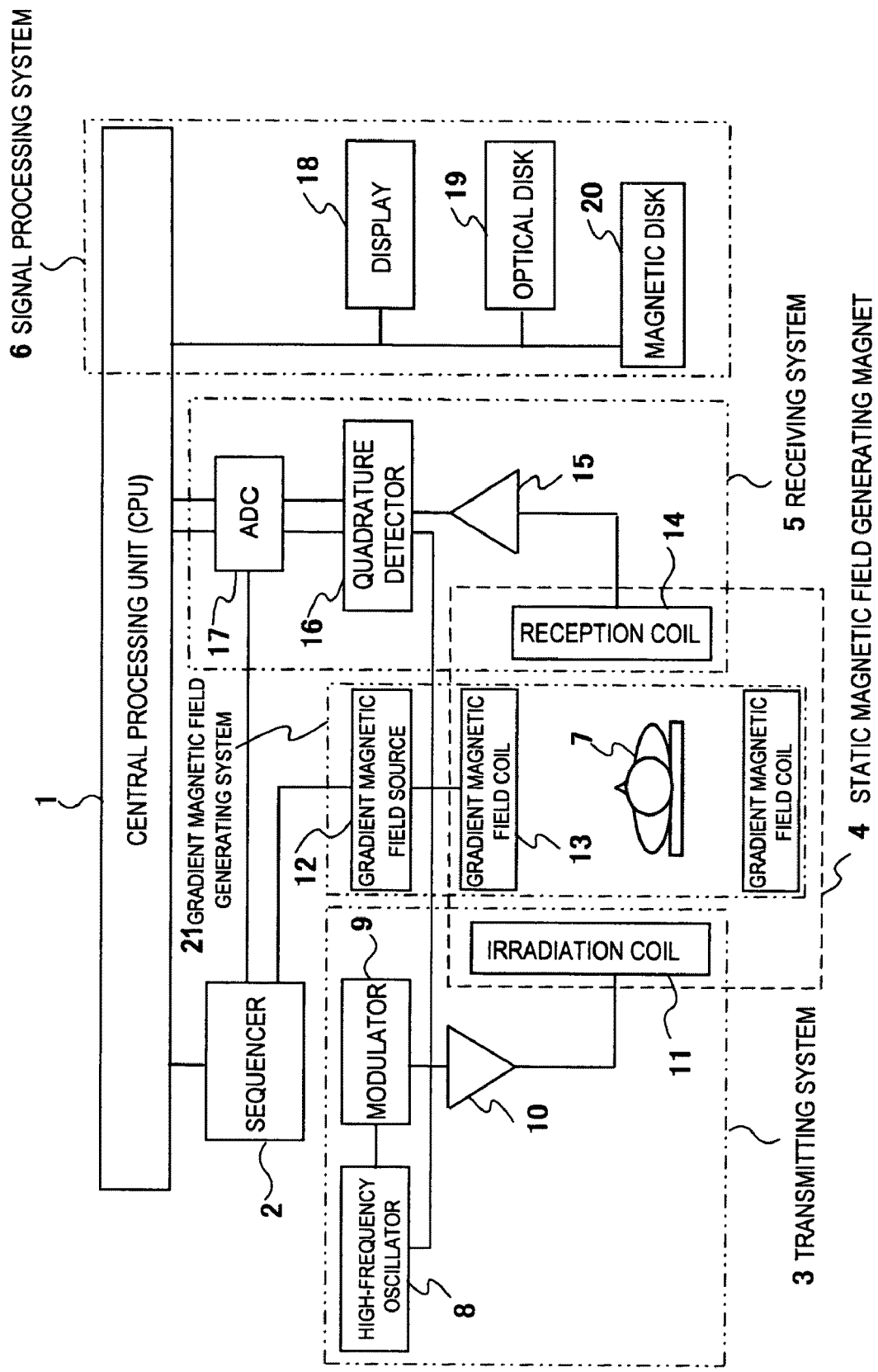
FIG. 1 is a system configuration of an MRI apparatus of the present invention.

Hereinafter, system configuration of the MRI apparatus configuring the present invention will be described in detail referring to FIG. 1.

The configuration of the MRI apparatus is classified broadly by central processing unit (CPU) 1, sequencer 2, transmitting system 3, static magnetic field generating magnet 4, receiving system 5, gradient magnetic field generating system 21 and signal processing system 6.

CPU 1 controls sequencer 2, transmitting system 3, receiving system 5 and signal processing system 6 in accordance with the program set in advance. Sequencer 2 is operated under control command of CPU 1, and transmits a variety of commands necessary for collecting image data of a fault place of object 7 to transmitting system 3, gradient magnetic field generating system 21 and receiving system 5.

Transmitting system 3 comprises devices such as high-frequency oscillator 8, modulator 6, irradiating coil 11 and RF shield, and irradiates predetermined pulsing electromagnetic waves to an object by amplitude-modulating a reference frequency pulse from high-frequency oscillator 8 in modulator 9 according to the command from sequencer 2, amplifying the amplify-modulated high-frequency pulses via high-frequency amplifier 10, and providing them to irradiating coil 11.

Static magnetic field generating magnet 4 causes homogeneous static magnetic field to be generated around object 7 in a predetermined direction. Irradiating coil 11, gradient magnetic field coil 13 and receiving coil 14 are disposed inside of static magnetic field generating magnet 4. Gradient magnetic field coil 13 is included in gradient magnetic field generating system 21, receives provision of current from gradient magnetic field source 12, and causes gradient magnetic field to be generated under control of sequencer 2.

Receiving system 5 is for detecting high-frequency signals (NMR signals) produced by nuclear magnetic resonance of nuclei of biomedical tissues of the object, has receiving coil 14, amplifier 15, quadrature detector 16 and A/D converter 17, and the high-frequency signals (NMR signals) as a response of the object to the electromagnetic waves irradiated from the above-mentioned irradiating coil 11 are detected in receiving coil 14 disposed in the vicinity of the object, inputted to A/D converter 17 via amplifier 15 and quadrature detector 16, converted into digital quantity, and the converted signals are transmitted to CPU 1.

Signal processing system 6 comprises an external memory device such as magnetic disk 20 or optical disk 19 and display 18 formed by devices such as CRT, process such as signal processing and image reconstructing process are performed by CPU 1 when data from receiving system 5 is inputted to CPU 1, displays the images of desired fault planes of object 7 on display 18 which are the result of the previously mentioned process, and stores them in a device such as magnetic disk 20 in the external memory device.

Further in the present invention, as reception coil 14, the coils referred to as a multiple RF coil or phased array coil is used which is formed by a plurality of small RF receiver coils. The multiple RF coil is a receive-only RF receiver coil capable of measuring a wide range of region with high-speed by extending the view while maintaining high sensitivity, by arranging the plurality of comparatively high sensitivity small RF receiver coils and combining the signals obtained by the respective small RF receiver coils.

Figure 2:
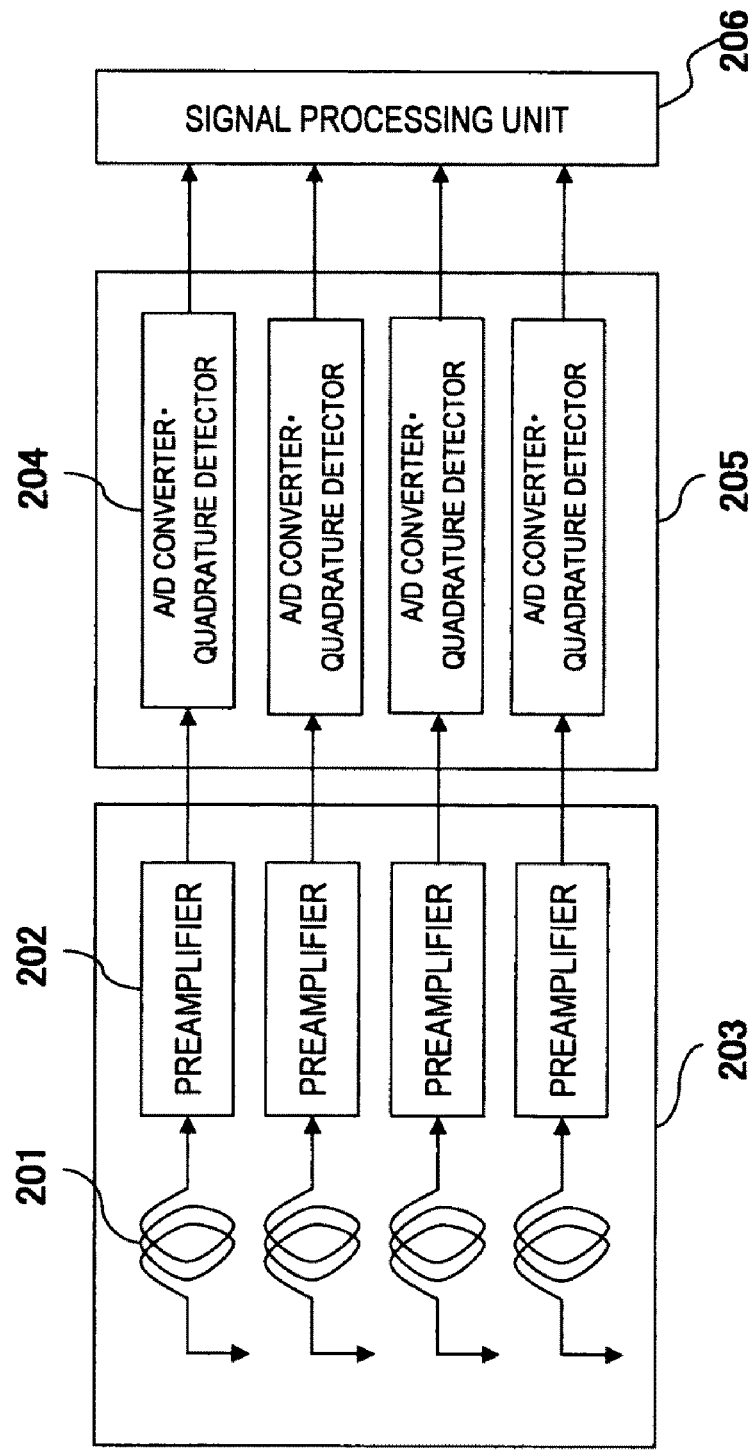
FIG. 2 shows a part of the signal detecting system of a multiple RF coil to which the present invention is applied.

A part of the signal detecting system of the multiple RF coils to which the present invention is applied will be described referring to FIG. 2. In FIG. 2, 201 indicates four small RF receiver coils, each of them are connected to the preamplifier indicated as 202, and multiple RF coil 203 is formed as a whole. Furthermore, the output power of four preamplifiers is respectively connected to each of four A/D converters • quadrature detector circuits 204. Signal detecting unit 205 is formed by four A/D converters • quadrature detector circuits 204, and the signals are detected here. The output power of A/D converter/quadrature detector circuits 204 is respectively connected to signal processing unit 206, and the Fourier transformation, filtering and composite operation are performed on the signals detected by A/D converters/quadrature detector circuits 204. The previously mentioned processes to be performed in signal processing unit 206 are incorporated in advance as a program. While the number of small RF receiver coils is four in FIG. 2, any number more than two can be used.

Figure 3:
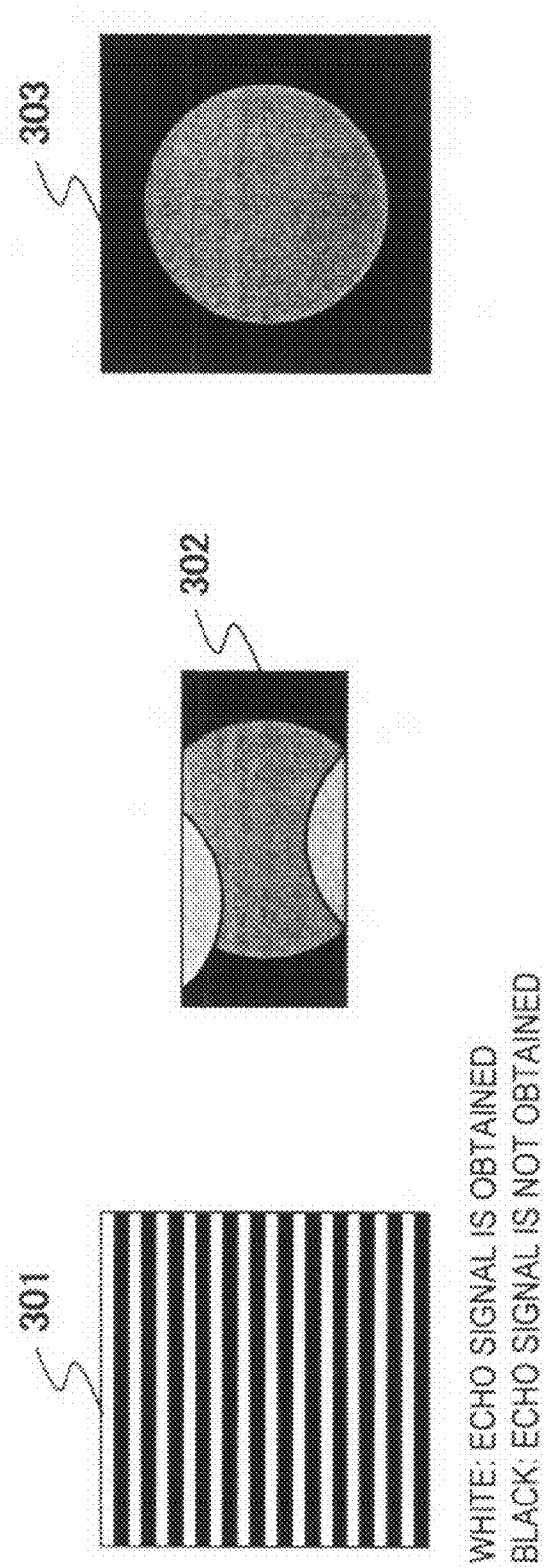
FIG. 3 illustrates the concept of a parallel imaging method to which the present invention is applied.

Also, the concept of the parallel imaging method to which the present invention is applied will be described referring to FIG. 3. In a parallel imaging method, high-speed imaging is performed implementing measurement by thinning out the repetition number of phase encodes at a constant rate using the multiple RF coil. The ratio of thinning out phase encodes is referred to as a reduction factor, and when, for example, reduction factor is 2 the repetition number of phase encodes becomes a half. Data on a k-space, when measured by thinning out phase encodes in the case that the reduction factor is 2, is alternately filled in as shown in 301 of FIG. 3. When an image is obtained on such k-space data by performing 2-dimensional Fourier transformation, aliasing artifacts generated in phase encode direction due to the number of phase codes being thinned out to a half, and the image turns out as shown in 302. On the other hand, the image without aliasing turns out as shown in 303. The images having aliasing as shown in 302 can be performed with unfolding process by the signal processing method referred to as SENSE method (refer to Non-Patent Document 1).

Non-Patent Document 1: Klaas P. Pruessmann et al, "SENSE: Sensitivity Encoding for Fast MRI" Magnetic Resonance in Medicine 42:952-962 (1999).

Next, a unfolding method of parallel imaging using the SENSE method will be described. When measurement is performed by thinning out phase encodes so as to make the phase encode number to be 1/N, N-times of aliasing are generated on the image after performing two-dimensional Fourier transformation, as mentioned above. Given this factor, in the parallel imaging method, measurement is carried out by thinning out the phase encodes to be 1/N using M-number of receiving coils of which the integer and more than N, and obtains M-number of images having N-times of aliasing. Then inverse matrix is performed on the image having N-times of aliasing using sensitivity distribution of M-number of receiving coils, whereby obtaining a unfolded image.

For example, in each pixel position of the image having aliasing artifacts there is a following relational expression between the pixel value of the image obtained by the respective small RF receiver coils, sensitivity distribution information of the respective small RF receiver coils and the pixel value in the respective aliasing positions of an object's image after unfolding process is carried out.

$$\begin{bmatrix} S_1 \\ S_2 \\ M \\ S_M \end{bmatrix} = \begin{bmatrix} C_{11} & C_{12} & \Lambda & C_{1N} \\ C_{21} & C_{22} & \Lambda & C_{2N} \\ M & M & \Lambda & M \\ C_{M1} & C_{M2} & \Lambda & C_{MN} \end{bmatrix} \begin{bmatrix} P_1 \\ P_2 \\ M \\ P_N \end{bmatrix} \quad \text{[Formula 1]}$$

$$\therefore S = CP \quad \text{[Formula 2]}$$

In formula 1, left-hand side vector indicates the pixel value in the image obtained by M-number of small RF receiver coils. Matrix $C_{ij}$ in the matrix on the left part of the right-hand side indicates the sensitivity in the j-th aliasing position of the i-th small RF receiver coil. Also, the vector on the right part of the right-hand side indicates the pixel value in the respective aliasing positions of the image after unfolding process is performed, and formula 1 is configured by N-number of pixel values corresponding to the N-number of aliasing of the image. Formula 2 is the condensed formula of formula 1. Unfolding process by parallel imaging method can be implemented by obtaining P through calculating inverse matrix of C in formula 2, etc. on the image by the respective small RF receiver coils expressed by S in formula 2. In concrete terms, it can be implemented by calculating the following formula 3.

$$P=(C^H C)^{-1} C^H S \qquad \text{[Formula 3]}$$

H: Adjoint Matrix −1: Inverse Matrix

On the other hand, in order to obtain image P of the object without aliasing by calculating a formula such as the inverse matrix expressed in formula 3, sensitivity distribution information C of the respective small RF receiver coils must be obtained. In the conventional technique disclosed in Patent Document 1, since matrix C is obtained as setting sensitivity information of the respective small RF receiver coils in the background region as zero or a fixed number, sensitivity information on the boundary between the object region and the background region rapidly declines whereby making the image obtained by unfolding become constrained and causing a problem of new artifacts being generated. In the present invention, matrix C is calculated by estimating sensitivity information in the background region as described in the embodiment below. Further, noise component contained in the unfolded image is suppressed by optimizing matrix C.

Embodiment 1

Figure 4:
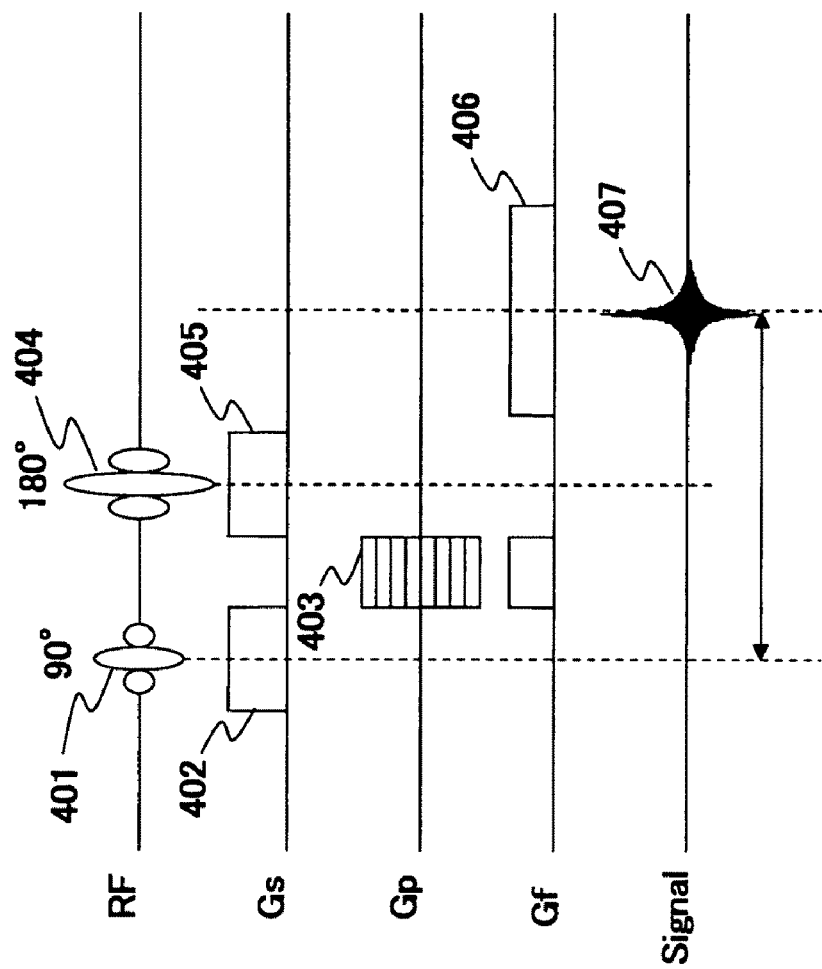
FIG. 4 shows an example of a pulse sequence to be applied in embodiment 1.

First, an example of the pulse sequence to be applied in embodiment 1 will be described referring to FIG. 4. The pulse sequence shown in FIG. 4 is a spin echo method, irradiation of RF pulse 401 and gradient magnetic field pulse 402 for slice selection are simultaneously applied first, and only the target fault plane is excited. Next, gradient magnetic field pulse 403 for phase encoding is applied in order to encode the positional information. Then the phase of proton dispersed over time is inverted 180 degrees, the phases are aligned again, and RF pulse 404 and gradient magnetic field pulse 405 for slice selection are irradiated to cause the echo signals generated. Finally, gradient magnetic field pulse 406 for signal readout is applied, and the echo signals are collected as indicated by 407.

Figure 5:
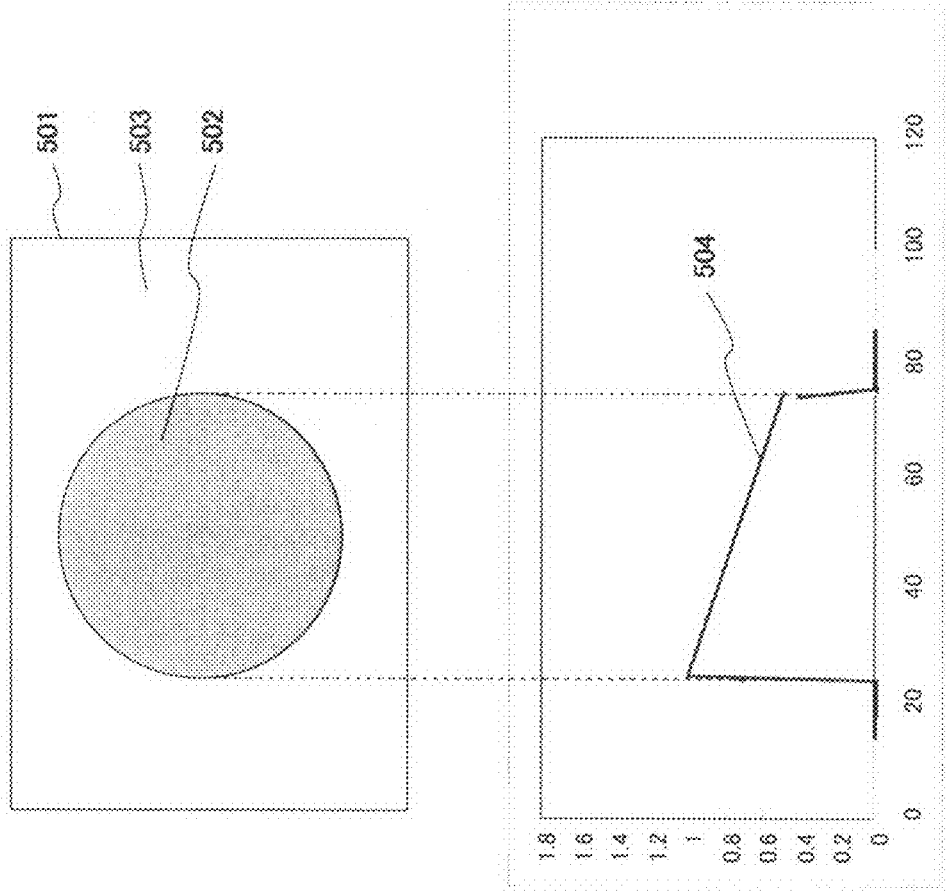
FIG. 5 is a schematic view of the case for calculating sensitivity information (sensitivity distribution) of the respective small RF receiver coils in embodiment 1 related to the present invention.
Figure 6:
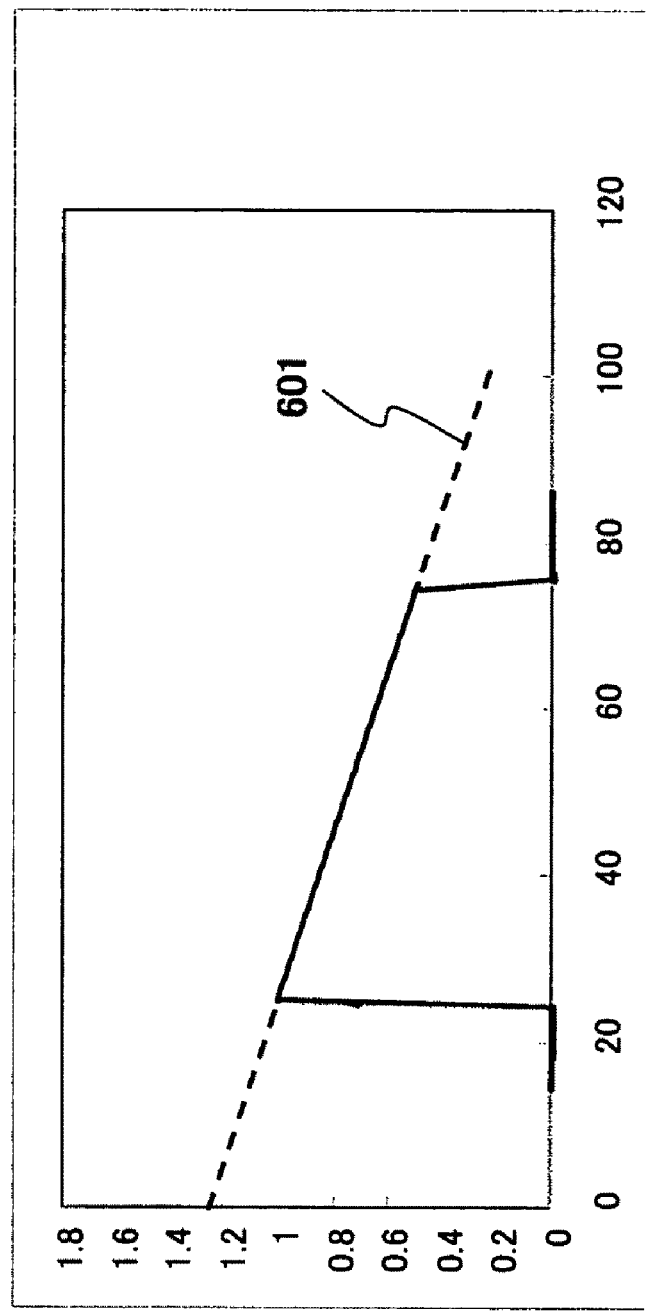
FIG. 6 shows the state of estimating sensitivity information of a background region by using the sensitivity information in an object region calculated in FIG. 5.
Figure 7:
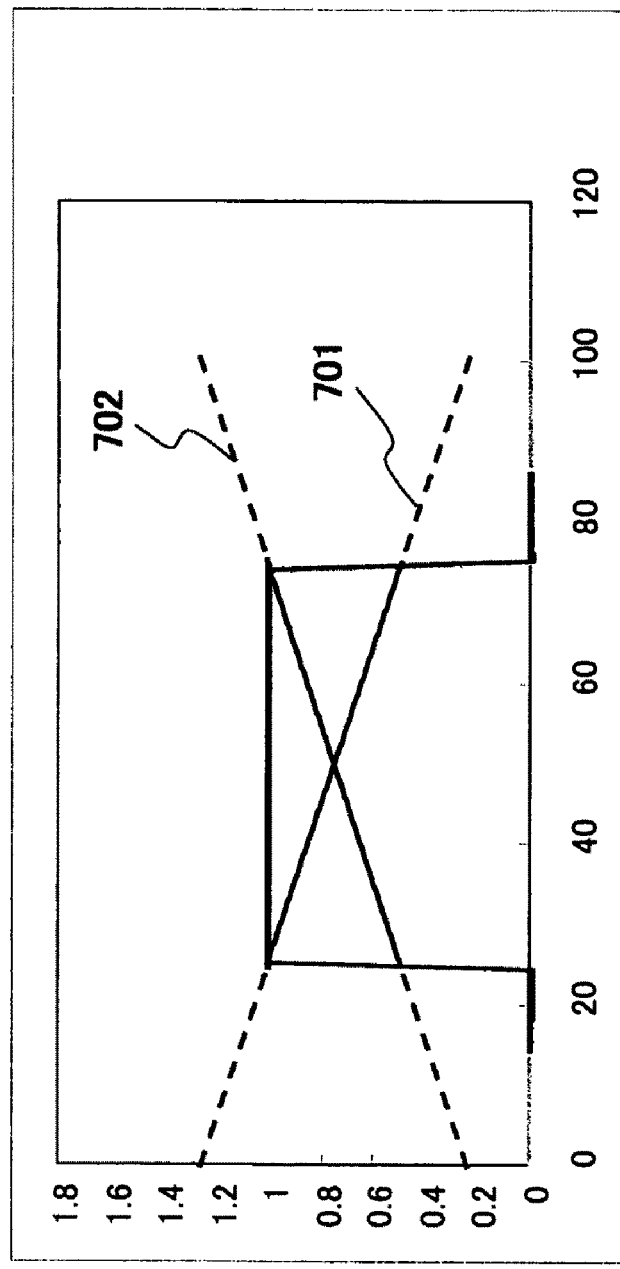
FIG. 7 shows the state of estimating sensitivity information of the background region as shown in FIG. 6 in the case having two small RF receiver coils.
Figure 8:
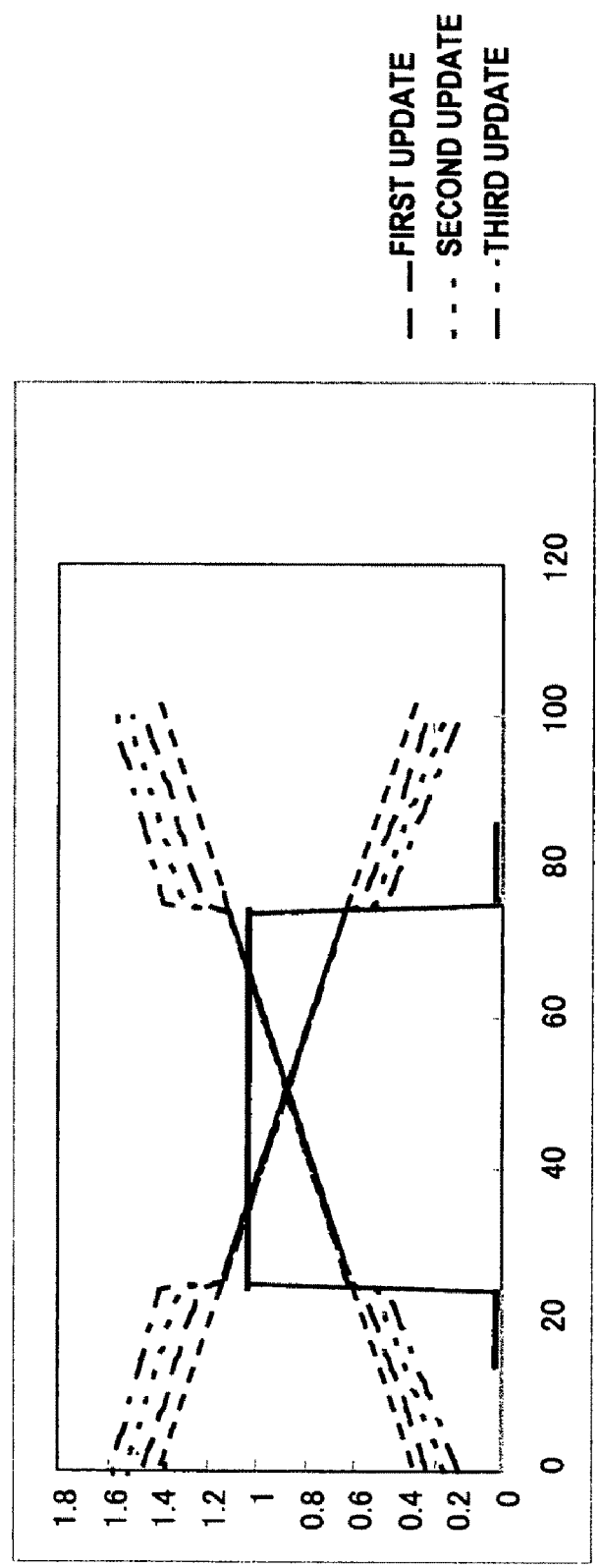
FIG. 8 shows how the sensitivity information of the respective small RF receiving coils changes with respect to every updating of sensitivity information.

FIG. 5 is a schematic view showing the case of calculating sensitivity information (sensitivity distribution) of the respective small RF receiver coils in embodiment 1 of the present invention. In FIG. 5, the upper diagram shows a phantom imaged by MRI, 501 shows an image of an object (a column-shaped phantom here), 502 shows an object region indicating the phantom, and 503 shows a background region. In FIG. 5, the lower diagram is an example for calculating sensitivity distribution of the small RF receiver coil with respect to the object region on the image by using the MR image of the phantom. It also shows, as seen in 504, the state of calculating the respective pixel values of the image obtained by imaging the phantom with respect to every small RF receiver coil as the sensitivity information with respect to the object region (phantom region), through dividing the pixel values of the image by the respective pixel values of the phantom image of the whole multiple RF coil. Further, FIG. 6 is shows the state of estimating sensitivity information of the background region by using the sensitivity information in the object region calculated in FIG. 5. More specifically, it is estimated as seen in 601 through extrapolation, by the two-dimensional fitting process to be described below. On the other hand, while sensitivity information with respect to one small RF receiver coil is illustrated in FIGS. 5 and 6, a plurality of small RF receiver coils is used in the actual parallel imaging method. FIG. 7 shows the state of estimating sensitivity information of the background region as shown in FIG. 6, in the case that two small RF receiver coils are used. In FIG. 7, 701 indicates sensitivity information by the small RF receiver coil disposed on the left hand of the diagram, and 702 indicates sensitivity information by the small RF receiver coils disposed on the right hand of the diagram. Further in the present embodiment, sensitivity information in the background region is updated by the calculation method to be described below so that sensitivity information in the background regions are made to be mutually different in the respective small RF receiver coils, whereby suppressing the lowering of SNR in the unfolded image caused due to noise contained in the background region. FIG. 8 illustrates how the sensitivity information of the respective small RF receiver coils change with respect to every update of the sensitivity information. According to FIG. 8, sensitivity information of two small RF receiver coils in the background region is found to be changing with respect to every updating as being mutually different (orthogonal to each other). As a result, it is possible to suppress the lowering of SNR in the unfolded image caused due to noise contained in the background region.

Figure 9:
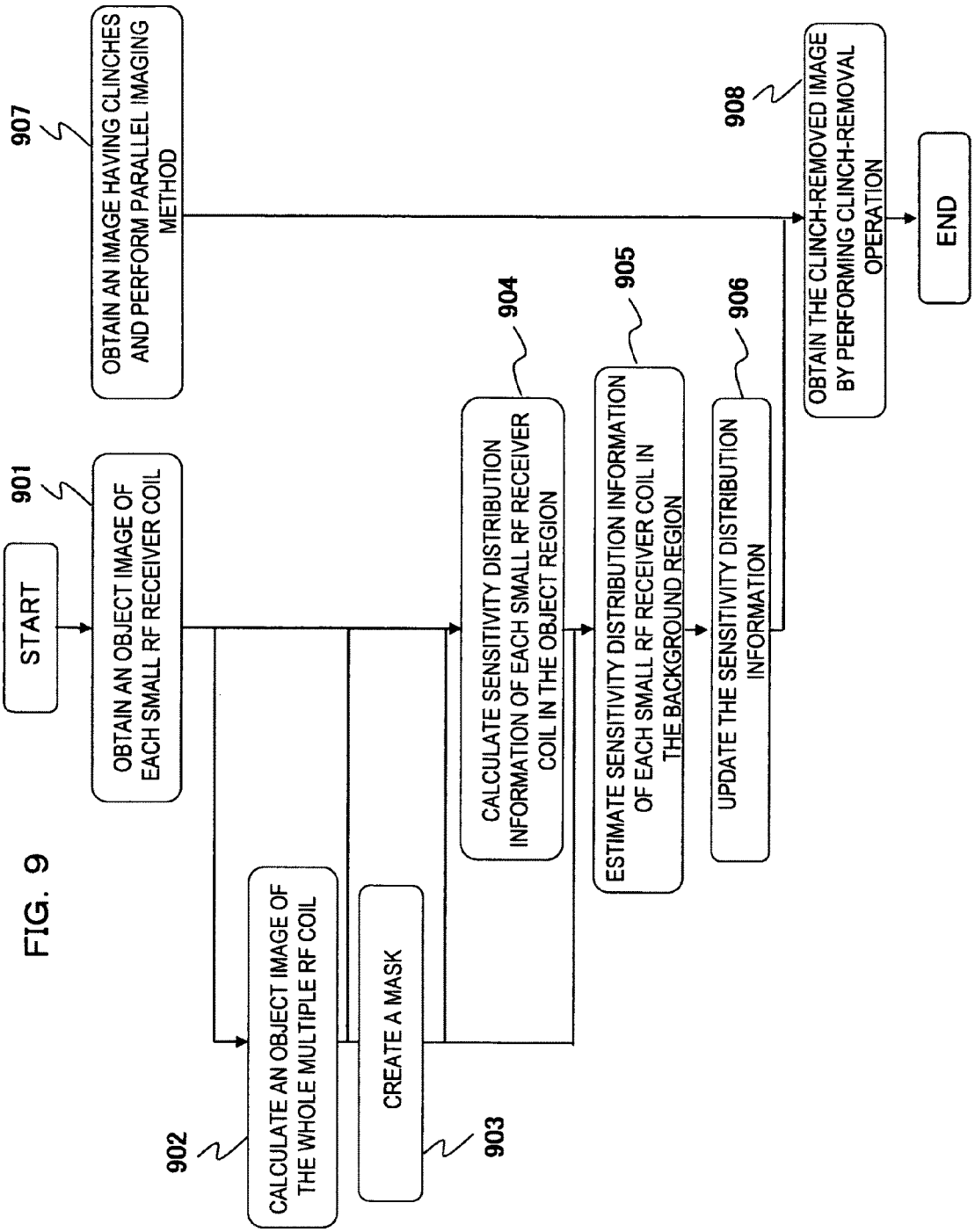
FIG. 9 is a flow chart for illustrating the concrete procedure of a parallel imaging method of the parallel imaging in the present embodiment.
Figure 10:
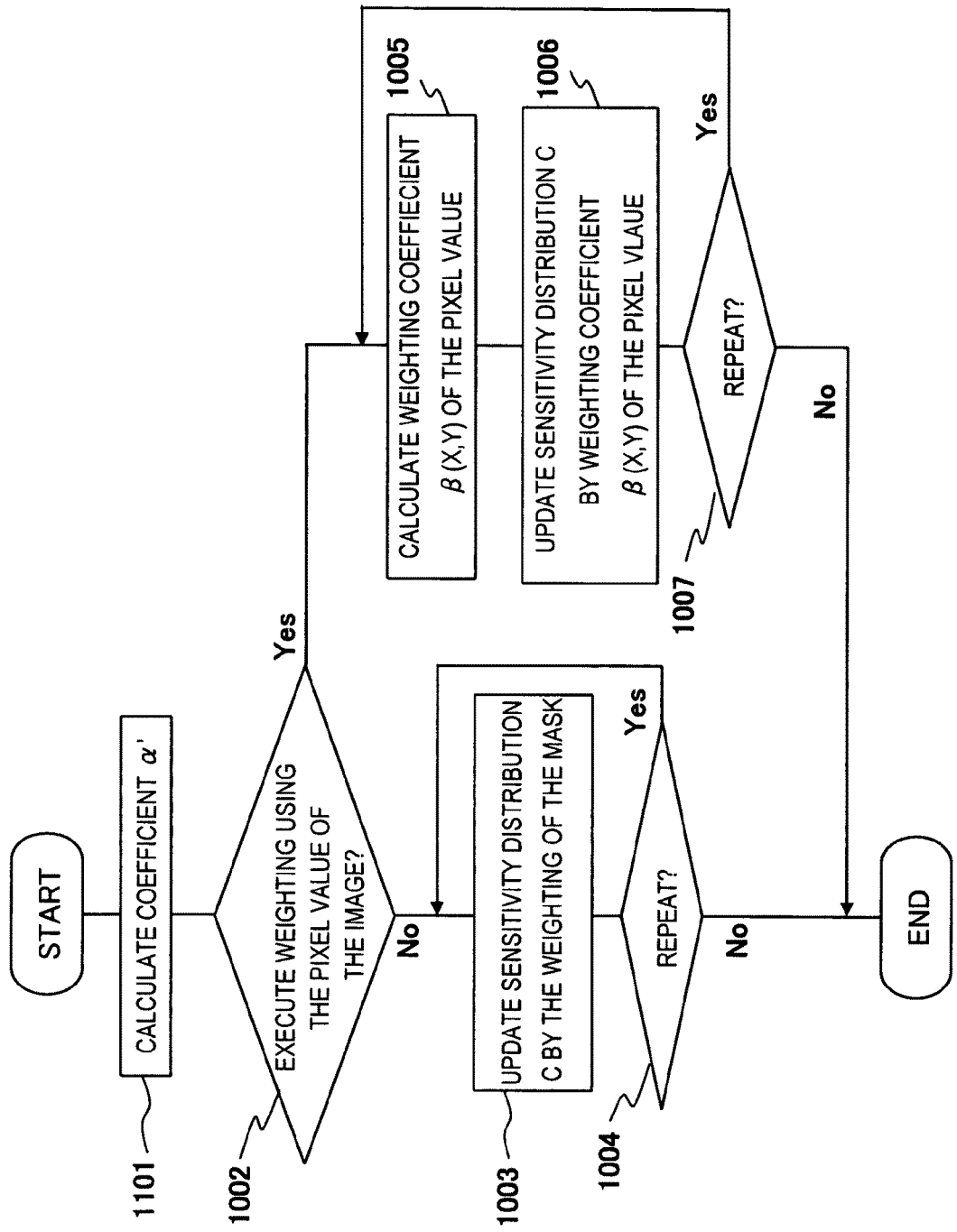
FIG. 10 is a flow chart illustrating details of the updating of sensitivity distribution information performed in step 906.

Hereinafter, concrete procedure of the parallel imaging method in the present embodiment will be described using the flow chart in FIG. 9.

(Step 901)

The object is imaged using the multiple RF coil, and the image of the object is obtained with respect to the respective small RF receiver coils that are forming the multiple RF coil.

(Step 902)

The images of the object with respect to the respective small RF receiver coils obtained in step 901 are synthesized, and the object image of the whole multiple RF coil is obtained.

(Step 903)

A mask is created using the object image of the whole multiple RF coil obtained in step 902. A mask is for distinguishing the object region and the background region in the image by performing binarization process on the object image of the whole multiple RF coil.

(Step 904)

In the object region obtained in step 902, sensitivity distribution with respect to every small RF receiver coil in the object region is obtained through performing division on the pixel value of the object image obtained in step 901 with respect to each small RF receiver coil by the pixel value of the object image of the whole multiple RF coil obtained in step 902.

(Step 905)

Sensitivity distribution of the respective small RF receiver coils in the background region is obtained by the performing of two-dimensional fitting process.

(Step 906)

By updating the sensitivity distribution information (sensitivity distribution matrix), sensitivity distribution with respect to each small RF receiver coil is made to be mutually different (orthogonalized) in the background region.

(Step 907)

An object image having aliasing artifacts is obtained by thinning out the phase encodes using the parallel imaging method.

(Step 908)

The image without aliasing is obtained by performing unfolding calculation on the object image having aliasing artifacts obtained in step 907 using sensitivity distribution with respect to each small RF receiver coil obtained in step 906.

Next, an example of calculation formula for using in the respective steps shown in the above-mentioned FIG. 9 will be described below in order.

First, the following formula 4 is to be performed upon obtaining the object image of the whole multiple RF coil by synthesizing the object images with respect to each small RF receiver coil in step 902.

$$r(x, y) = \sqrt{\sum_{i=1}^{M} |W_i(x, y)|^2} \quad \text{[Formula 4]}$$

In formula 4, i is a subscript representing the number of the respective small RF receiver coils, M is the number of the respective small RF receiver coils, $w_i(x,y)$ is the image obtained by the respective small RF receiver coils, and $r(x,y)$ is the object image of the whole multiple RF coil obtained in step 902. In accordance with formula 4, the object image of the whole multiple RF coil can be obtained by the weighted average.

Next, formula 5 expresses the calculation formula of the mask to be obtained in step 903.

$$m(x, y) = 1 \text{ only } r(x, y) \geq \frac{r_{max}}{10} \quad \text{[Formula 5]}$$
$$m(x, y) = 0 \text{ only } r(x, y) < \frac{r_{max}}{10}$$

The mask is for distinguishing the object region and the background region in the image, and can be obtained by performing binarization process on object image $r(x,y)$ of the whole multiple RF coil. This binarization process uses, for example, one tenth of maximum pixel values of the object image of the whole multiple RF coils as a threshold value, and the image having the value of 0 and 1 is obtained by formula 5 and generated. In formula 5, $m(x,y)$ is the mask, and $r_{max}$ is the maximum pixel value in the object image of the whole multiple RF coils. Setting of the threshold value in formula 5 may be carried out by creating a histogram of the object image of the whole multiple coil and setting the threshold value from the created histogram, or may be calculated from the noise level of the sensitivity distribution image of the whole multiple RF coil.

Next, the following formula 6 is a calculation formula upon obtaining the sensitivity distribution with respect to each small RF receiver coil in the object region in step 904.

$$c_i(x, y) = \frac{W_i(x, y)}{r(x, y)} \quad \text{[Formula 6]}$$

In formula 6, $c_i(x,y)$ represents the sensitivity information of each small RF receiver coil. $C_i(x,y)$ can be obtained through dividing the respective pixel values of the object image with respect to the respective small RF receiver coils by the respective pixel values of the object image of the whole multiple RF coil.

Next, the following formulas 7~9 are the calculation formulas to be used upon obtaining sensitivity information of the respective small RF receiver coils in the background region by performing the two-dimensional fitting process in step 905.

The 2-dimensional fitting process in step 905 is executed by expressing real part $c'_{real}(x,y)$ and imaginary part $c'_{imgn}(x,y)$ of an estimated value of the sensitivity distribution as formula 7, and obtaining coefficient of formula 4 to make the residual equation formed by formula 8 to be the minimum. In this regard, however, to obtain the solution to make formula 8 to be the minimum, the simultaneous equation expressed in formula 9 should be resolved.

$$c'_{real}(x, y) = kr_1 + kr_2 \cdot y + kr_3 \cdot x + kr_4 \cdot y^2 + kr_5 \cdot x^2 + kr_6 \cdot xy \quad \text{[Formula 7]}$$
$$c'_{imgn}(x, y) = ki_1 + ki_2 \cdot y + ki_3 \cdot x + ki_4 \cdot y^2 + ki_5 \cdot x^2 + ki_6 \cdot xy$$

$$\Delta E_{real} = \sum_{x,y} \{c_{real}(x, y) - c'_{real}(x, y)\}^2 \times m(x, y) \quad \text{[Formula 8]}$$

$$\Delta E_{imgn} = \sum_{x,y} \{c_{imgn}(x, y) - c'_{imgn}(x, y)\}^2 \times m(x, y)$$

$$\frac{\partial \Delta E_{real}}{\partial kr_j} = 0, \quad \text{[Formula 9]}$$
$$\frac{\partial \Delta E_{imgn}}{\partial ki_j} = 0,$$
$$j = 1, 2, 3, 4, 5, 6$$

In formula 7, $kr_j$, $kr_j(j=1\sim6)$ is a coefficient of the 2-dimentional fitting to be obtained. In formula 8, $m(x,y)$ is a mask obtained by formula 5. Also, in step 905, sensitivity information of the object region obtained by formula 6 and sensitivity distribution of the background region obtained by estimation using formulas 7~9 are combined and set as $c'(x,y)$.

Figure 11:
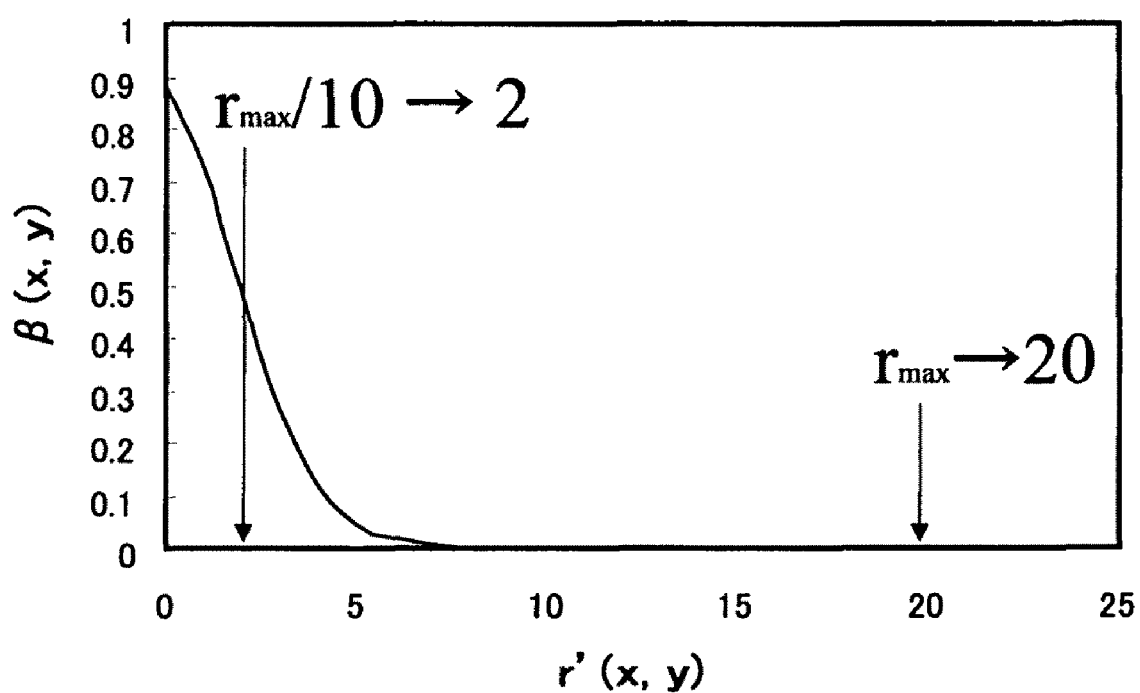
FIG. 11 shows a plotting of coefficient β(x,y) obtained by formula 15 with respect to r'(x,y).

Next, the details on updating of sensitivity distribution information to be executed in step 906 will be described referring to the flow chart in FIG. 11.

(Step 1001)

For example, α' is calculated which is a constant number for deciding how much the sensitivity distribution (matrix) should be changed. More specifically, α' is calculated by obtaining the average value of the absolute value of the sensitivity distribution for all of the respective small RF receiver coils in accordance with the following formula 10, multiplying the obtained average value by itself, and using the number multiplied by, for example, 0.3.

$$C_{Ave} \frac{1}{M \times X \times Y} \sum_{i=1}^{M} \sum_{x=1}^{X} \sum_{y=1}^{Y} |c_i(x, y)| \quad \text{[Formula 10]}$$
$$\alpha' = C_{Ave}^2 \times 0.3$$

(Step 1002)

Whether weighting of the change of sensitivity distribution matrix should be performed using the mask obtained in step 903 or it should be performed using the pixel value of the object image is determined. When weighting is performed using a mask step 1003 is to proceed, and when it is performed using the pixel value 1005 is to proceed. Determination in the present step is arbitrarily made by a factor such as the kind of coils being connected to the MRI apparatus or the kind of sequence being used for the imaging.

(Step 1003)

Change of the matrix of sensitivity distribution is executed using weighting by the mask obtained in step 903. More specifically, change of the matrix of sensitivity distribution is executed based on formula 12 and formula 13 using coefficient α obtained by formula 11.

$$\alpha = (1 - m(x,y)) \times \alpha' \quad \text{[Formula 11]}$$

$$C' = C + \alpha \times C(C^H \Psi^{-1} C)^{-1} \quad \text{[Formula 12]}$$

$$C' = C + \alpha \times C(C^H C)^{-1} \quad \text{[Formula 13]}$$

In this regard, however, formula 12 is a formula for changing the matrix taking into consideration a receiver noise matrix expressing noise correlation generated in the respective coils, and formula 13 is a formula for changing the matrix without taking into consideration receiver noise matrix. Changing of a matrix in each sensitivity distribution is executed on all matrixes corresponding to the respective pixel positions.

(Step 1004)

Determination is made whether to execute the change of sensitivity distribution again or not. When determined to change it again step 1003 is to proceed, and when determined not to change the procedure is ended.

(Step 1005)

Coefficient β(x,y) for performing weighting to change the sensitivity distribution matrix is calculated using the pixel value of the object image. In this weighting coefficient, a small change of sensitivity distribution matrix elements is made in the region having high signal intensity in the whole sensitivity image (object region), and a greater change of sensitivity distribution matrix elements is made in the region having low signal intensity in the whole sensitivity image (background region). The coefficient β(x,y) can be obtained by, for example, normalizing the whole image and assigning it to the logistic function. The calculation of coefficient β(x,y) in the present embodiment is performed, for example, by the following formulas 14 and 15.

$$r'(x, y) = \frac{r(x, y)}{r_{max}} \times 20 \quad \text{[Formula 14]}$$

$$\beta(x, y) = \frac{1}{1 + \exp(r'(x, y) - 2)} \quad \text{[Formula 15]}$$

Formula 14 is an identity formula for normalizing the whole sensitivity image to the value of 0~20, and formula 15 is an identity formula for obtaining the weighting function using the logistic function (formula 16 below). When coefficient β(x,y) obtained by formula 15 is plotted with respect to r'(x,y), it turns out to be as shown in FIG. 11. In this regard, however, in FIG. 11, the value of 20 on the horizontal axis indicates the maximum value of the pixel value and threshold value $r_{max}/10$ used for creating the mask in formula 14 is indicated as the value of 2 on the horizontal axis. In accordance with FIG. 11, it is found that coefficient β(x,y) for performing weighting is obtained by formula 14 and formula 15 so that it becomes smooth having threshold value $r_{max}/10$ as a border.

$$\eta = \frac{1}{1 + \exp(-\lambda)} \quad \text{[Formula 16]}$$

(Step 1006)

Change on the matrix of sensitivity distribution is executed based on formula 12 and formula 13 using coefficient β(x,y) obtained by the following formula 17.

$$\alpha = \beta(x,y) \times \alpha' \quad \text{[Formula 17]}$$

Figure 12:
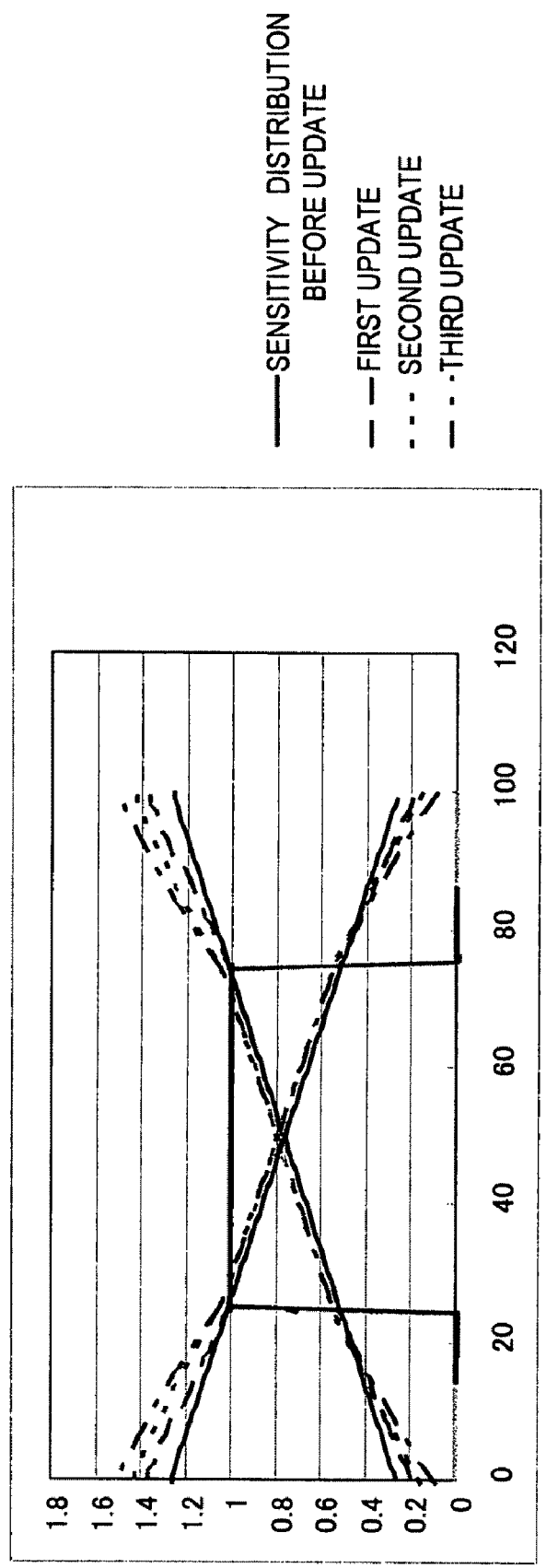
FIG. 12 shows the state of weighting performed by pixel values of the whole image in the case of having two small RF receiver coils.

In the present step, through changing the sensitivity distribution by formula 12 or formula 13 using the value expressed in formula 17, in case that the number of the small RF receiver coils is, for example, two, as shown in FIG. 12, weighting can be performed so that the change of sensitivity distribution is made small in the region having high signal intensity in the whole image (object region) and the change of sensitivity distribution is made large in the region having low signal intensity in the whole image (background region).

(Step 1007)

Determination is made whether to change the matrix of sensitivity distribution again or not. When determined to change it again step 1005 is to proceed, and when determined not to change the procedure is ended.

Next, demonstration is made for proving that SNR of the image after unfolding process is improved by changing the matrix of sensitivity distribution using formulas 12 and 13.

First, SNR of the image obtained by the parallel imaging method is as follows. That is, in accordance with formula 24 of Non-patent Document 1, SNR of the image obtained by unfolding can be generally expressed by the following formula by SNR of the image obtained by the MRI method.

$$SNR_p^{red} = \frac{SNR_p^{full}}{g_p \sqrt{N}} \quad \text{[Formula 18]}$$

In formula 18, $SNR_p^{red}$ represents SNR of the image obtained by thinning out phase encodes to be 1/N, and $SNR_p^{full}$ represents SNR of the image obtained by usual MRI method. Subscript p is to be used for separation of the signals upon unfolding process, and indicates that the formula is a relational expression of SNR with respect to the p-th pixel position obtained by unfolding (1≦p≦N) using the pixel value of coordinate (x,y) in the image before unfolding process is performed. Denominator $g_p$ in formula 18 is referred to as a geometric factor, the minimum value thereof is 1, a variable which becomes smaller as sensitivity distribution of the respective small RF receiver coils get more independent of each other, and is expressed by the following formulas 19 and 20.

$$g_p = \sqrt{[(C^H \Psi^{-1} C)^{-1}]_{p,p} (C^H \Psi^{-1} C)_{p,p}} \geq 1 \quad \text{[Formula 19]}$$

$$g_p = \sqrt{[(C^H C)^{-1}]_{p,p} (C^H C)_{p,p}} \geq 1 \quad \text{[Formula 20]}$$

In this regard, however, formula 19 is an expression when the receiver noise matrix is taken into consideration, and formula 20 is an expression when the receiver noise matrix is not taken into consideration.

While geometric factor in formula 18 becomes small by changing the matrix of the sensitivity distribution in formula 12 and formula 13 whereby improving SNR of the image after unfolding process is performed expressed in formula 3, such improvement of SNR will be demonstrated below by the following formulas 21 and 22.

$$\sqrt{[(C^H\Psi^{-1}C')^{-1}]_{p,p}(C'^H\Psi^{-1}C')_{p,p}} \leq \sqrt{[(C^H\Psi^{-1}C)^{-1}]_{p,p}(C^H\Psi^{-1}C)_{p,p}}$$ [Formula 21]

$$\sqrt{[(C'^HC')^{-1}]_{p,p}(C'^HC')_{p,p}} \leq \sqrt{[(C^HC)^{-1}]_{p,p}(C^HC)_{p,p}}$$ [Formula 22]

In this regard, however, formula 21 is an expression when the receiver noise matrix is taken into consideration, and formula 22 is an expression when the receiver noise matrix is not taken into consideration.

First, demonstration of formula 21 is performed. Here, Hermitian matrix V is defined by the following formula 23.

$$V = C^H \Psi^{-1} C$$ [Formula 23]

In order to form formula 21, matrix C of the sensitivity distribution should be altered in the direction to which Hermitian matrix V shown in formula 23 is diagonalized.

First, the change quantity dC of sensitivity distribution by formula 12 can be expressed as follows using formula 23.

$$dC = \alpha C V^{-1}$$ [Formula 24]

On the other hand, the change quantity dV of Hermitian matrix V can be obtained as the following formula 25 by changing the sensitivity distribution using formula 12.

$$\begin{aligned} dV &= dC^H \Psi^{-1} dC \\ &= (\alpha C V^{-1})^H \Psi^{-1} \alpha C V^{-1} \\ &= \alpha (V^{-1})^H C^H \Psi^{-1} \alpha C V^{-1} \\ &= \alpha^2 (V^{-1})^H V V^{-1} \\ &= \alpha^2 (V^{-1})^H \\ &= \alpha^2 V^{-1} \end{aligned}$$ [Formula 25]

Since the diagonal component of Hermitian matrixes V and $V^{-1}$ is positive real number, the rate of diagonal component increases by adding them, whereby enabling formula 21 to be formed. Formula 22 can be obtained in the same manner. Also, updating of the sensitivity information calculated by formula and formula 13 has the same effect when the updating is repeated a plurality of times.

In accordance with the above-described embodiment, in the parallel imaging, artifacts generated in the prior art are reduced by obtaining sensitivity distribution of the respective receiver coils of the part which does not exist in the object by extrapolation and using it for calculation of the inverse matrix in the unfolding calculation. Also, since the sensitivity distribution matrix obtained by extrapolation is optimized, it is possible to prevent the lowering of SNR due to noise contained in the background region, whereby enabling acquisition of high-quality images.

More specifically, optimization of sensitivity distribution matrix was performed through changing the value of the geometric factor in the above-described embodiment to be small. In other words, by making the value of the geometric factor small, sensitivity distribution of the plurality of small RF receiver coils are made to be spatially and mutually different, whereby making it possible to suppress the lowering of SNR caused due to noise contained in the background region. Updating process of the above-mentioned sensitivity distribution matrix can be also expressed as the process to update sensitivity distribution information in the respective background regions by mutually using sensitivity distribution information of the plurality of small RF receiver coils whereby suppressing noise components contained in the unfolded images.

Embodiment 2

Figure 13:
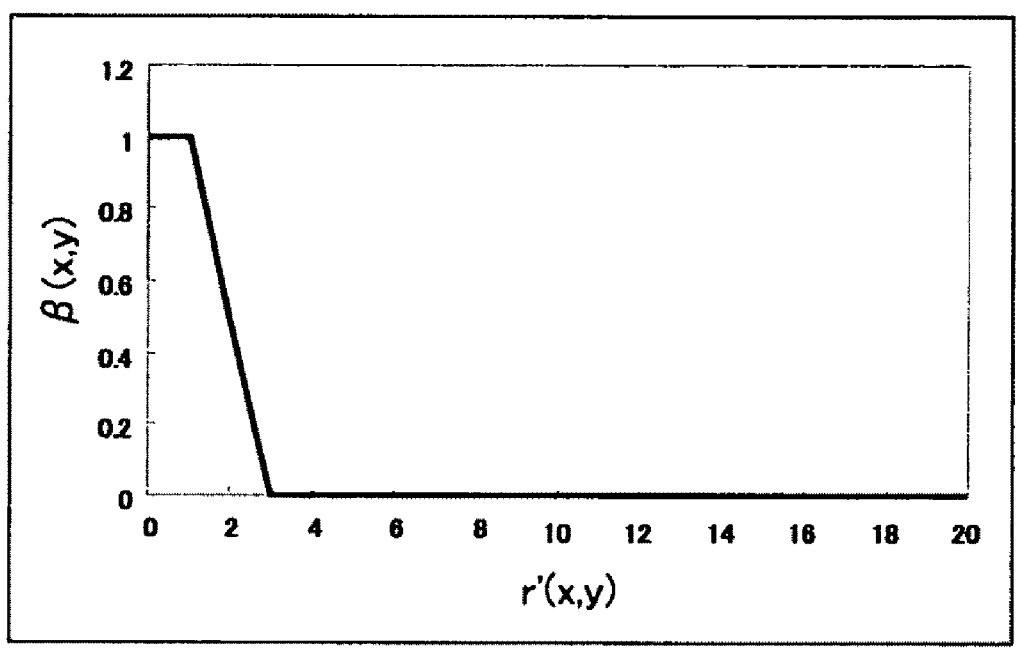
FIG. 13 shows an example of a piecewise linear function illustrated in embodiment 2.

Next, embodiment 2 will be described. Embodiment 2 is another example of weighting function used in step 1005 of embodiment 1. The function to be used in embodiment 2 is referred to as the piecewise linear function, and represented in the following formula 26 and in FIG. 13. In this regard, however, when formula 26 is expressed in a general formula, it will be expressed as formula 27.

$$\beta(x,y)=1 \ (r'(x,y)<1)$$

$$\beta(x,y)=-\tfrac{1}{2} \times r'(x,y)+2 \ (1 \leq r'(x,y) \leq =3)$$

$$\beta(x,y)=0 \ (3<r'(x,y))$$ [Formula 26]

$$\eta=1 \ (\lambda<a)$$

$$\eta=-c\times\lambda+a\times c+1 \ (a \leq \lambda \leq a+1/c)$$

$$\eta=0 \ (a+1/c<\lambda)$$ [Formula 27]

In formula 27, "a" is a starting point of the linear function, and "c" is a slope of the linear function (sign inversion). When the piecewise linear function in this embodiment is used, the weighting coefficient can also be obtained by making the change of the matrix elements in sensitivity distribution small in the region having high signal intensity in the whole sensitivity image, and by making the change of matrix in sensitivity distribution large in the region having low signal intensity in the whole sensitivity image.

Embodiment 3

Figure 14:
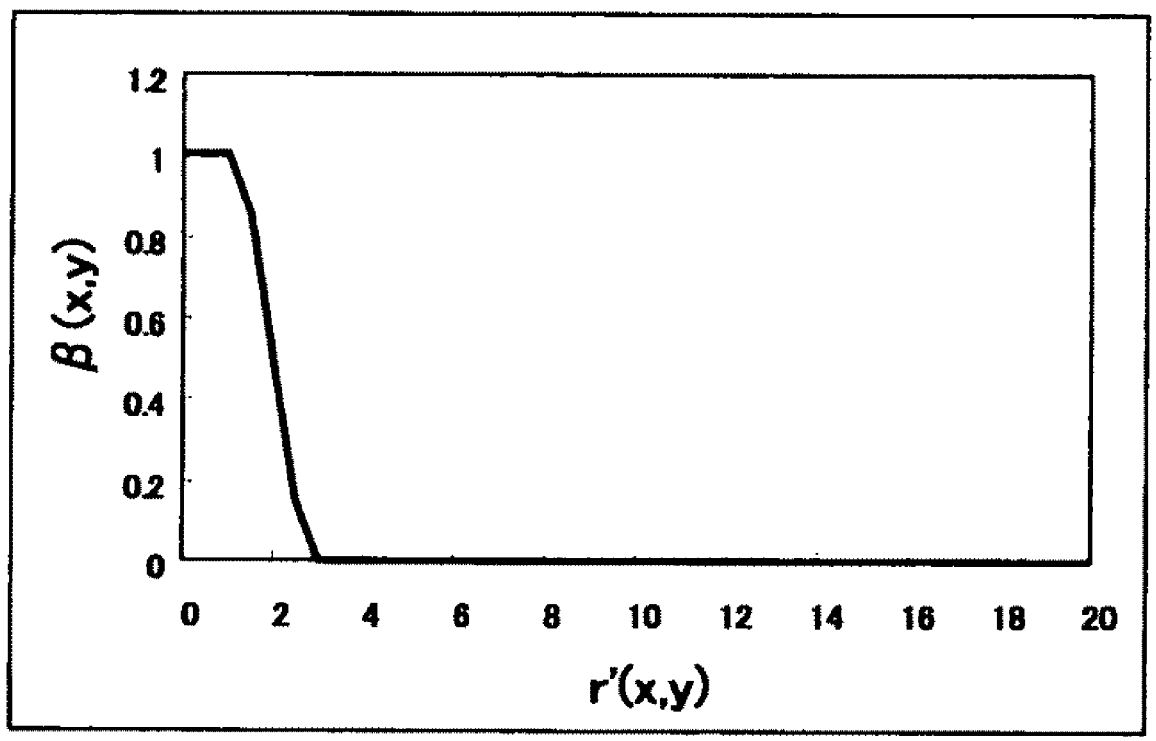
FIG. 14 shows an example of a piecewise cosine function illustrated in embodiment 3.

Next, embodiment 3 will be described. Embodiment 3 is another example of the weighting function to be used in step 1005 of embodiment 1. The function to be used in embodiment 3 is referred to as the piecewise cosine function, and is represented in the following formula 28 and in FIG. 14. In this regard, however, formula 28 is expressed as formula 29 when expressed in general formula.

$$\beta(x,y)=1 \ (r'(x,y)<1)$$

$$\beta(x,y)=0.5+0.5\times\cos(\pi/2 \ast (r'(x,y)-1)) \ (1 \leq r'(x,y) \leq 3)$$

$$\beta(x,y)=0 \ (3<r'(x,y))$$ [Formula 28]

$$\eta=1(\lambda<a)$$

$$\eta=0.5+0.5\times\cos(\pi/d \ast (\lambda-a))(a \leq \lambda \leq a+d)$$

$$\eta=0(a+d<\lambda)$$ [Formula 29]

In formula 29, "a" represents a starting point of the cosine function, and "d" represents the range of the cosine function. When the piecewise cosine function in the present embodiment is used, the weighting function can also be obtained by making the change of the matrix elements in sensitivity distribution small in the region having high signal intensity in the whole sensitivity image, and by making the change of matrix elements in sensitivity distribution large in the region having low signal intensity in the whole sensitivity image.

The present invention is not intended to be limited to the above-mentioned embodiments, and various changes may be made without departing from the scope of the invention.

Optimization by changing the matrix of sensitivity distribution by the above-mentioned formula 12 and formula 13 is to be executed at least once, for example, about 3 times.

Also, the sequence to be applied to the present invention is not limited to the spin echo method illustrated in FIG. 4. It goes without saying that the present invention can be applied to methods such as a gradient echo method or fast spin echo method. Also, while the parallel imaging method for thinning out data and execute unfolding process in phase encode direction is described in the above-mentioned embodiment, the parallel imaging method of the present invention can be applied also in signal-readout direction.

As for the multiple RF coil to which the present invention is applied, there are possible coils to be used such as the one described in Non-Patent Document 2 as a horizontal magnetic field multiple RF coil for head region, the one described in Non-Patent Document 3 as a horizontal magnetic field QD coil for head region, and the one described in Non-Patent Document 4 as a horizontal magnetic field QD coil for abdominal region.

Non-Patent Document 2: Christoph Leussler, "Array Head Coil for Improved Functional MRI" 1996 ISMRM abstract P249

Non-Patent Document 3: H. A. Stark et al. "Helmet and Cylindrical Shaped CP Array Coils for Brain Imaging: A Comparison of Signal-to-Noise Characteristics", 1996 ISMRM abstract P1412

Non-Patent Document 4: T. Takahashi et al. "Four-Channel Wrap-Around Coil with Inductive Decoupler for 1.5 T Body Imaging", 1995 ISMRM abstract P1418

Also, the weighting function to be used in step 1105 does not have to be the logistic function, piecewise linear function or piecewise cosine function, and other functions may be used. Also, the method for acquiring β(x,y) by making it depend on the distance from the object region does not have to be the method described in embodiment 4, and other methods may be used. It is conceivable that a suitable β(x,y) can be acquired by specifying the region manually and arbitrarily.

The invention claimed is:

1. A magnetic resonance imaging apparatus comprising:
    a plurality of high-frequency reception coils;
    sensitivity distribution information obtaining means for calculating sensitivity distribution information of the plurality of high-frequency reception coils respectively;
    sensitivity distribution storage means for storing the sensitivity distribution information;
    measuring means for acquiring magnetic resonance signals by thinning out encode steps of a k-space;
    image reconstruction means for reconstructing images by using the magnetic resonance signals; and
    means for performing unfolding calculation by using the sensitivity distribution information and the image, thereby acquiring the unfolded images,
    characterized in further comprising:
    means for estimating the sensitivity distribution information of a background region by using the sensitivity distribution information of an object region; and
    means for updating the sensitivity distribution information in each background region mutually using sensitivity distribution information of the plurality of high-frequency reception coils, thereby suppressing noise components contained in the unfolded images, wherein the updating of the sensitivity distribution information is carried out so that the sensitivity distribution information of the plurality of high-frequency reception coils becomes spatially and mutually different.

2. The magnetic resonance imaging apparatus according to claim 1, wherein the updating of sensitivity distribution information is performed so that sensitivity distribution information on each of the plurality of high-frequency reception coils become orthogonal to each other.

3. The magnetic resonance imaging apparatus according to claim 1, wherein the updating of sensitivity distribution information is performed by increasing sensitivity distribution information with respect to at least one high-frequency reception coil, and by decreasing it with respect to at least one of the other high-frequency reception coils.

4. The magnetic resonance imaging apparatus according to claim 1, wherein the sensitivity distribution information is updated by performing weighting that is depending on the pixel value of the object image, and by making the weighting larger as the pixel value of the region gets lower.

5. The magnetic resonance imaging apparatus according to claim 4, wherein the weighting is performed using a logistic function.

6. The magnetic resonance imaging apparatus according to claim 1, wherein the sensitivity distribution information is expressed by a matrix wherein the number of lines or the number of rows is the number for thinning out the encode steps or the number of the high-frequency reception coils, and the updating of sensitivity distribution information reduces the value of geometric factor of the matrix whereby suppressing noise components contained in the unfolded images.

7. The magnetic resonance imaging apparatus according to claim 6, characterized in that the updating of sensitivity distribution information is performed by adding to the matrix C the matrix wherein determinant of matrix $C(C^H \Psi^{-1} C)^{-1}$ or $C(C^H C)^{-1}$ is multiplied by a desired coefficient, in the case that the matrix is indicated by C, the matrix representing the function of noise between the respective high-frequency reception coils is indicated by Ψ and calculation of adjoint matrix is indicated by H.

8. The magnetic resonance imaging apparatus according to claim 7, characterized in comprising means for inputting the desired coefficient.

9. The magnetic resonance imaging apparatus according to claim 1, wherein the sensitivity distribution information obtaining means obtains the sensitivity distribution information by dividing the pixel value of the object image obtained using the respective high-frequency reception coils by the pixel value of the image obtained using all of the plurality of high-frequency reception coils.

10. The magnetic resonance imaging apparatus according to claim 1, characterized in comprising mask processing means for determining, in the image of the object, the pixel positions to which the background region belong and the pixel positions to which the object region belong.

11. The magnetic resonance imaging apparatus according to claim 10, wherein the sensitivity distribution information in the background region obtained by the mask processing means is generated by an extrapolating process using the sensitivity distribution information in the object region.

12. A magnetic resonance imaging method comprising:
    (1) a step for obtaining magnetic resonance signals by thinning out encode steps of a k-space using a plurality of high-frequency reception coils;
    (2) a step for reconstructing an image using the magnetic resonance signals obtained by the step (1);

(3) a step for obtaining a unfolded image by performing unfolding calculation using the sensitivity distribution information of the plurality of high-frequency reception coils and the image;

(4) a step for estimating the sensitivity distribution information of a background region by using the sensitivity distribution information of an object region; and (5) a step for suppressing noise components contained in the unfolded image by updating the sensitivity distribution information in each background region by mutually using sensitivity distribution information of the plurality of high-frequency reception coils, wherein the magnetic resonance imaging method further comprises before the step (1)~step (5):

(6) a step for obtaining magnetic resonance signals by imaging the object by a common method using the plurality of high-frequency reception coils;

(7) a step for reconstructing a magnetic resonance image of the object with respect to each high-frequency reception coil using the magnetic resonance signal obtained by the step (6); and (8) a step for calculating sensitivity distribution information with respect to each of the plurality of high-frequency reception coils using the magnetic resonance image obtained in the step (7).

13. The magnetic resonance imaging method according to claim 12, wherein the step (8) includes:

(9) a step for generating an averaged image with respect to the magnetic resonance image of every high-frequency reception coil obtained by the step (7), by calculating the average of each pixel; and

(10) a step for calculating sensitivity distribution information with respect to each of the plurality of high-frequency reception coils through dividing the magnetic resonance image of every high-frequency reception coil obtained in the step (7) by the averaged image.

14. The magnetic resonance imaging method according to claim 13, comprising:

(11) a step for discriminating a background region and an object region with respect to the averaged image obtained by the step (9) by performing a mask processing thereto, wherein the calculation of sensitivity distribution information in the background region of the step (10) is executed by an extrapolation process using the sensitivity distribution information in the object region.

15. The magnetic resonance imaging method according to claim 13, wherein the updating of sensitivity distribution information in the step (5) is performed by adding weight that is depending on the pixel value of the averaged image obtained by the step (9), and by making the weighting larger as the pixel value of the region gets lower.

16. The magnetic resonance imaging method according to claim 12, characterized in that the step (5) is executed a plurality of times.

* * * * *